United States Patent
Lee et al.

(10) Patent No.: US 9,997,591 B2
(45) Date of Patent: Jun. 12, 2018

(54) CAPACITOR AND A SEMICONDUCTOR DEVICE INCLUDING THE SAME

(71) Applicant: Samsung Electronics Co., Ltd., Suwon-si (KR)

(72) Inventors: Jin-su Lee, Hwaseong-si (KR); Gihee Cho, Seongnam-si (KR); Dongkyun Park, Seoul (KR); Hyun-Suk Lee, Suwon-si (KR); Heesook Park, Hwaseong-si (KR); Jongmyeong Lee, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/212,299

(22) Filed: Jul. 18, 2016

(65) Prior Publication Data
US 2017/0069711 A1    Mar. 9, 2017

(30) Foreign Application Priority Data

Sep. 9, 2015 (KR) .......................... 10-2015-0127786

(51) Int. Cl.
*H01L 49/02* (2006.01)

(52) U.S. Cl.
CPC .................... *H01L 28/75* (2013.01)

(58) Field of Classification Search
None
See application file for complete search history.

(56) References Cited

U.S. PATENT DOCUMENTS

| | | | |
|---|---|---|---|
| 6,287,965 B1 | 9/2001 | Kang et al. | |
| 6,673,668 B2 | 1/2004 | Kim et al. | |
| 8,357,583 B2 | 1/2013 | Hirota et al. | |
| 2002/0022334 A1* | 2/2002 | Yang | H01L 28/56 438/396 |
| 2006/0186452 A1* | 8/2006 | Nam | H01L 27/10852 257/308 |
| 2007/0284677 A1* | 12/2007 | Chang | H01L 21/28088 257/412 |
| 2008/0313531 A1 | 12/2008 | Song et al. | |

(Continued)

FOREIGN PATENT DOCUMENTS

| | | |
|---|---|---|
| KR | 10-2003-0050051 A | 6/2003 |
| KR | 10-2005-0067502 | 7/2005 |

(Continued)

*Primary Examiner* — Marc Armand
*Assistant Examiner* — Sue Tang
(74) *Attorney, Agent, or Firm* — Muir Patent Law, PLLC

(57) ABSTRACT

A semiconductor device is disclosed. The semiconductor device includes a substrate and capacitor electrically connected to the substrate. The capacitor includes a lower electrode, a dielectric layer disposed on the lower electrode, and an upper electrode disposed on the dielectric layer. The upper electrode includes a first electrode on the dielectric layer and a second electrode on the first electrode, such that the first electrode is disposed between the dielectric layer and the second electrode. The first electrode contains metal oxynitride having a formula of $M_xO_yN_z$, in which an atomic ratio (y/x) of oxygen (O) to metallic element (M) is a value in the range from 0.5 to 2.

9 Claims, 20 Drawing Sheets

(56) References Cited

U.S. PATENT DOCUMENTS

2011/0028002 A1  2/2011  Hirota
2015/0031204 A1  1/2015  Sasaki et al.
2015/0061074 A1  3/2015  Lee et al.

FOREIGN PATENT DOCUMENTS

KR      10-0510473 B1    10/2005
KR   10-2010-0078496 A    7/2010
KR   10-2015-0028396 A    3/2015

* cited by examiner

CAPACITOR AND A SEMICONDUCTOR DEVICE INCLUDING THE SAME

CROSS-REFERENCE TO RELATED APPLICATIONS

This U.S. non-provisional patent application claims priority under 35 U.S.C. § 119 to Korean Patent Application No. 10-2015-0127786, filed on Sep. 9, 2015, in the Korean Intellectual Property Office, the entire contents of which are hereby incorporated by reference.

BACKGROUND OF THE INVENTION

The disclosed embodiments relate to a capacitor and a semiconductor device including the same, and in particular, to a capacitor with improved reliability and a method of fabricating a highly-integrated semiconductor device including the capacitor.

Due to their small-sized, multifunctional, and/or low-cost characteristics, semiconductor devices are widely used as important elements in the electronic industry. However, with advances in the electronic industry, semiconductor devices are becoming more and more highly integrated, and thus, many technical issues may arise. For example, as an integration density of the semiconductor device increases, it may be useful for patterns thereof to have a decreasing line width and/or space and an increasing height and/or aspect ratio. However, this may lead to an increased difficulty in a layer deposition process, poor uniformity in an etching process, and deterioration in reliability of the semiconductor device.

SUMMARY

Some embodiments of the inventive concept provide a capacitor with increased capacitance.

Some embodiments of the inventive concept provide a semiconductor device including a capacitor with increased capacitance.

According to some embodiments of the inventive concept, a semiconductor device may include a substrate and a capacitor formed on the substrate. In some embodiments, the capacitor may include a lower electrode, a dielectric layer disposed on the lower electrode, and an upper electrode disposed on the dielectric layer. The upper electrode may include a first electrode disposed on the dielectric layer and a second electrode disposed on the first electrode, such that the first electrode is between the dielectric layer and the second electrode and wherein the first electrode contains metal oxynitride having a formula of $M_xO_yN_z$, in which an atomic ratio (y/x) of oxygen (O) to metallic element (M) has a value selected from a range from about 0.5 to about 2.

In some embodiments, in the first electrode, an atomic percent of oxygen (O) may be higher than that of nitrogen (N).

In some embodiments, in the first electrode, a sum of atomic percentages of oxygen (O) and nitrogen (N) may range from about 60 at % to about 70 at %.

In some embodiments, in the first electrode, an atomic percent of metallic element (M) may range from about 30 at % to about 40 at %.

In some embodiments, in the first electrode, a content of oxygen (O) has a value may be in the range from about 15 at % to about 70 at %.

In some embodiments, the first electrode may include a first portion adjacent to the dielectric layer and a second portion adjacent to the second electrode, and the first and second portions may have uniform concentrations of metallic element (M), oxygen (O), and nitrogen (N) throughout the first electrode.

In some embodiments, the first electrode may be in direct contact with the dielectric layer.

In some embodiments, the second electrode may be thicker than the first electrode.

In some embodiments, the semiconductor device may include a gate electrode provided on the substrate to cross an active region of the substrate, first and second impurity regions formed in the active region and at both sides of the gate electrode, wherein the capacitor is electrically connected to the first impurity region.

In some embodiments, the metallic element (M) of the first electrode may include, for example, one of titanium (Ti), zirconium (Zr), aluminum (Al), hafnium (Hf), tantalum (Ta), niobium (Nb), yttrium (Y), lanthanum (La), vanadium (V), and manganese (Mn).

In some embodiments, the second electrode may contain metal nitride, whose metallic element may be the same as the metallic element (M) of the first electrode.

In some embodiments, the dielectric layer may include at least one selected from the group consisting of zirconium oxide (ZrO), aluminum oxide (AlO), hafnium oxide (HfO), zirconium hafnium oxide (ZrHfO), hafnium aluminum oxide (HfAlO), zirconium aluminum oxide (ZrAlO), zirconium silicate (ZrSiO), hafnium silicate (HfSiO), and zirconium hafnium silicate (ZrHfSiO).

According to some embodiments of the inventive concept, a semiconductor device may include a substrate and a capacitor electrically connected to the substrate. In some embodiments, the capacitor may include a lower electrode, a dielectric layer disposed on the lower electrode, a first upper electrode disposed on the dielectric layer, and a second upper electrode disposed on the first upper electrode. The first upper electrode may contain metal oxynitride having a formula of $M_xO_yN_z$, in which a content of metallic element (M) is an amount may be in the range from about 30 at % to about 40 at % and a content of oxygen (O) is an amount may be in the range from about 15 at % to about 70 at %.

In some embodiments, in the first upper electrode, a content of nitrogen (N) is an amount may be in the range from about 0 at % to about 55 at %.

In some embodiments, the metallic element (M) of the first upper electrode may be titanium (Ti), and the second upper electrode may contain titanium nitride (TiN).

In some embodiments, the first upper electrode may contact with the dielectric layer, and the second upper electrode may contact with the first upper electrode.

In some embodiments, the semiconductor device may further include a bit line, which is electrically connected to the second impurity region and may be provided to cross the gate electrode.

In some embodiments, a semiconductor device may include a substrate and a capacitor electrically connected to the substrate. In some embodiments, the capacitor may include a lower electrode, a dielectric layer disposed on the lower electrode, a first upper electrode disposed on the dielectric layer, and a second upper electrode disposed on the first upper electrode, wherein the first upper electrode may contain metal oxynitride having a formula of $M_xO_yN_z$, in which an atomic percent of oxygen (O) may be higher than an atomic percent of metallic element (M) and the dielectric layer may contain metal oxide, in which an oxygen (O) content of the dielectric layer may be lower than the oxygen (O) content of the first upper electrode.

In some embodiments, in the first upper electrode, an atomic ratio (y/x) of oxygen (O) to metallic element (M) has a value in the range from 0.5 to 2.

In some embodiments, the second upper electrode may contain metal nitride in which an oxygen (O) content of the second upper electrode may be lower than the oxygen content the first upper electrode.

In some embodiments, the first upper electrode may include a first portion adjacent to the dielectric layer and a second portion adjacent to the second upper electrode, and both the first and the second portions of the first upper electrode may contain uniform concentrations of metallic element (M), oxygen (O), and nitrogen (N) throughout the first upper electrode.

In some embodiments, in the first upper electrode, a content of metallic element (M) is an amount may be in the range from about 30 at % to about 40 at % and a content of oxygen (O) is an amount may be in the range from about 15 at % to about 70 at %.

In some embodiments, the third upper electrode contains metal oxynitride whose oxygen content is lower than that of the first upper electrode and higher than that of the second upper electrode.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 8A through 13A are plan views illustrating a method of fabricating a semiconductor device, according to some embodiments of the inventive concept.

FIGS. 8B through 13B are sectional views taken along lines I-I' of FIGS. 8A through 13A, respectively.

Figure 1:
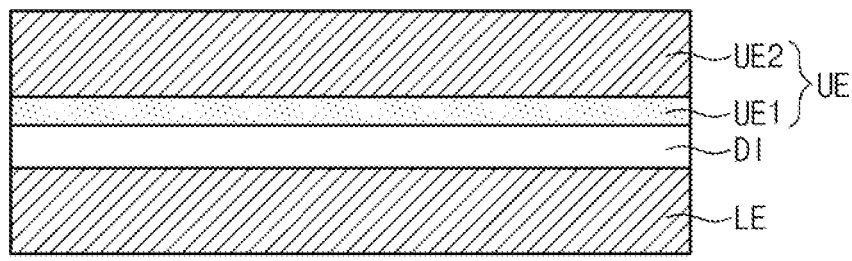
FIG. 1 is a sectional view illustrating a capacitor according to some embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that more fully hereinafter with reference to the accompanying drawings, in which various eme details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

Although the figures described herein may be referred to using language such as rated for clarity. Like numbers refer to like elements throughout. Though the different figures show variations to be mutually exclusive from other figures or descriptions, unless the context so indicates. Therefore, certain aspects from certain figures may be the same as certain features in other figures, and/or certain figures may be different representations or different portions of a particular exemplary embodiment.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as be described referring to plan views and/or cross-sectional views by way erein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Also these spatially relative terms such as ed referring to plan views and/or cross-sectional views by way erein for ease of description to describe one element's or feature's relationship to another element(s) or feature(s) as illustrated in the fimething in the sky is generally above something on the ground, even if it is not directly above).

Terms such as tially relative "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Terms such as tially relative "planar," or "coplanar," as use sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

As used herein, items described as being perspective views of some cross-segured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

Components described as thermally connected or in thermal communication are arranged such that heat will follow a path between the components to allow the heat to transfer from the first component to the second component. Simply because two components are part of the same device or package does not make them thermally connected. In general, components which are heat-conductive and directly connected to other heat-conductive or heat-generating components (or connected to those components through intermediate heat-conductive components or in such close proximity as to permit a substantial transfer of heat) will be described as thermally connected to those components, or in thermal communication with those components. On the contrary, two components with heat-insulative materials therebetween, which materials significantly prevent heat transfer between the two components, or only allow for incidental heat transfer, are not described as thermally connected or in thermal communication with each other. The terms "heat-conductive" or "thermally-conductive" do not apply to a particular material simply because it provides incidental heat conduction, but are intended to refer to materials that are typically known as good heat conductors or known to have utility for transferring heat, or components having similar heat conducting properties as those materials.

As used herein, a semiconductor device may refer to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a sectional view illustrating a capacitor according to some embodiments of the inventive concept.

Referring to FIG. 1, a capacitor may include a lower electrode LE, a dielectric layer DI, and an upper electrode UE.

The lower electrode LE may include at least one of doped silicon, metals, metal nitrides, or metal silicides. In some embodiments, the lower electrode LE may include at least one selected from the group consisting of refractory metals (e.g., cobalt (Co), titanium (Ti), nickel (Ni), tungsten (W), and molybdenum (Mo)) and noble metals (e.g., platinum (Pt), ruthenium (Ru), and iridium (Ir)). In certain embodiments, the lower electrode LE may include at least one of metal nitrides (e.g., titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), and tungsten nitride (WN)). In certain embodiments, the lower electrode LE may include at least one of conductive noble metal oxide (such as, PtO, $RuO_2$, or $IrO_2$) or conductive oxide materials (such as, SRO ($SrRuO_3$), BSRO (($Ba,Sr)RuO_3$), CRO ($CaRuO_3$), LSCo). In certain embodiments, the lower electrode LE may include titanium (Ti) or titanium nitride (TiN).

The lower electrode LE may be formed by at least one of a physical vapor deposition (PVD), a chemical vapor deposition (CVD) process, and an atomic layer deposition (ALD) process.

The dielectric layer DI may be formed of or include at least one of high-k dielectric materials, whose dielectric constants are higher than that of silicon oxide. For example, the dielectric layer DI may be formed of or include at least one of zirconium oxide (ZrO), aluminum oxide (AlO), hafnium oxide (HfO), zirconium hafnium oxide (ZrHfO), hafnium aluminum oxide (HfAlO), or zirconium aluminum oxide (ZrAlO). Alternatively, the dielectric layer DI may include at least one selected from the group consisting of zirconium silicate (ZrSiO), hafniumsilicate (HfSiO), and zirconium hafnium silicate (ZrHfSiO). However, the material for the dielectric layer DI may not be limited to the above materials. The dielectric layer DI may be provided to have a single- or multi-layered structure.

The dielectric layer DI may also be formed by at least one of the PVD, CVD, and ALD processes.

The upper electrode UE may include a first upper electrode UE1 on the dielectric layer DI and a second upper electrode UE2 on the first upper electrode UE1. The first upper electrode UE1 may be contact the dielectric layer DI. The second upper electrode UE2 may be spaced apart from the dielectric layer DI with the first upper electrode UE1 interposed therebetween. The second upper electrode UE2 may contact the first upper electrode UE1. The second upper electrode UE2 may have a greater thickness than the first upper electrode UE1 in a first direction. For example, the first upper electrode UE1 may have a thickness ranging from about 1 Å to about 50 Å, and the second upper electrode UE2 may have a thickness ranging from about 10 Å to about 100 Å. In some embodiments, the ratio of thickness between the second upper electrode UE2 and the first upper electrode UE1 is between 10:1 and 2:1.

The first upper electrode UE1 may include metal oxynitride ($M_xO_yN_z$). The metallic element (M) of the first upper electrode UE1 may be, for example, one of titanium (Ti), zirconium (Zr), aluminum (Al), hafnium (Hf), tantalum (Ta), niobium (Nb), yttrium (Y), lanthanum (La), vanadium (V), and manganese (Mn). For example, the first upper electrode UE1 may be formed of or include titanium oxynitride ($Ti_xO_yN_z$).

In some embodiments, in the first upper electrode UE1, an atomic percent of the metallic element (M) may range from about 30 at % to about 40 at %. For example, a sum of atomic percentages of oxygen (O) and nitrogen (N), except for the metallic element (M) may range from about 60 at % to about 70 at %. In some embodiments, an atomic ratio (y/x) between oxygen (O) and metallic element (M) may range from about 0.5 to about 2 (e.g., may have a value or amount in the range between about 0.5 and 2). In the first upper electrode UE1, the atomic percent of oxygen (O) may be higher than that of nitrogen (N). For example, in the first upper electrode UE1, the atomic percent of oxygen (O) may range from about 15 at % to about 70 at % and the atomic percent of nitrogen (N) may range from about 0 at % to about 55 at %. Therefore, in some embodiments where a metal oxynitride is used, when the total atomic percent of combined oxygen (O) and nitrogen (N) is about 70 at %, the atomic percent of oxygen (O) may be between 36 at % and 69 at %, and the atomic percentage of nitrogen (N) may be between 34 at % and 1 at % such that the total adds up to 70 at %. When the total atomic percent of combined oxygen (O) and nitrogen (N) is about 60 at %, the atomic percent of oxygen (O) may be between 31 at % and 59 at %, and the atomic percentage of nitrogen (N) may be between 29 at % and 1 at % such that the total adds up to 60 at %.

In some embodiments, the atomic ratio (y/x) may be controlled by adjusting a cycle ratio between source materials of the metallic element (M) and the oxygen (O) in an atomic layer deposition (ALD) process, which will be described below. Alternatively, the atomic ratio (y/x) may be controlled by adjusting a source supplying condition in the atomic layer deposition (ALD) process, which will also be described below.

In some embodiments, composition of the metallic element (M), the oxygen (O), and the nitrogen (N) in the first upper electrode UE1 may be uniform throughout the first upper electrode UE1. For example, the first upper electrode UE1 may include a first portion adjacent to the dielectric layer DI (e.g., vertically adjacent such that a boundary of the first portion of the upper electrode UE1 is vertically adjacent a boundary of the dielectric layer DI) and a second portion adjacent to the second upper electrode UE2 (e.g., vertically adjacent such that a boundary of the second portion of first upper electrode UE1 is vertically adjacent a boundary of the second upper electrode UE2), and the first and second portions may have the same, uniform concentrations of the metallic element (M), the oxygen (O), and the nitrogen (N). For example, in some embodiments, the content of the metallic element (M) is the same in both the first and second portions of the first upper electrode UE1, the content of the oxygen (O) is the same in both the first and second portions of the first upper electrode UE1, and the content of the nitrogen is the same in both the first and second portions of the first upper electrode UE1.

In some embodiments, the second upper electrode UE2 may be formed of or include at least one of metal nitrides and a metallic element of the second upper electrode UE2 may be the same as the metallic element (M) of the first upper electrode UE1. For example, the second upper electrode UE2 may be formed of or include one of titanium (Ti), zirconium (Zr), aluminum (Al), hafnium (Hf), tantalum (Ta), niobium (Nb), yttrium (Y), lanthanum (La), vanadium (V), and manganese (Mn). In some embodiments, the second upper electrode UE2 may be formed of or include titanium nitride (TiN). In some embodiments, the composition of the metallic element (M) in the second upper electrode UE2 may be uniform throughout the second upper electrode UE2. For example, the content of the metallic element (M) in a bottom portion of the second upper electrode UE2 adjacent to the first upper electrode UE1 is the same as the content of the metallic element (M) in a top portion of the second upper electrode UE2 (e.g., a portion away from the first upper electrode UE1). In some embodiments, oxygen (O) content of the second upper electrode UE2 is lower than the oxygen (O) content of the first upper electrode UE1.

In some embodiments, the first upper electrode UE1 may be provided between the dielectric layer DI and the second upper electrode UE2 to suppress oxygen atoms from moving from the dielectric layer DI to the second upper electrode UE2. For example, where oxygen atoms in the dielectric layer DI are diffused into and reacted with the metallic element (e.g., Ti) of the second upper electrode UE2, oxygen vacancy may be formed in the dielectric layer DI to serve as a source of leakage current. As a result, dielectric constant of the dielectric layer D1 may be reduced causing a reduction in capacitance of a capacitor. To address these shortcomings, according to exemplary embodiments, the first upper electrode is formed in such a manner so that the oxygen content of the first upper electrode UE1 is higher than the oxygen content of the dielectric layer D1 (e.g., an atomic weight of oxygen, and/or an atomic percentage). For example, oxygen atoms (O) may be purposefully added to an upper electrode of a capacitor (e.g., to the first upper electrode UE1) at an atomic percentage and/or oxygen to metal ratio far higher than might naturally occur by oxygen migration where oxygen atoms are not purposefully added to the upper electrode. Accordingly, it is possible to suppress oxygen atoms (O) from moving from the dielectric layer DI into the second upper electrode UE2. As a result, an improved electric reliability of the capacitor may be achieved.

In some embodiments, in the first upper electrode UE1, an atomic percent of oxygen (O) is higher than an atomic percent of metallic element (M), and an oxygen (O) content (e.g., number of oxygen (O) atoms) of the dielectric layer D1 is lower than the oxygen (O) content of the first upper electrode UE1. Since the first upper electrode UE1 contains a high atomic percent of oxygen (O) and/or contains more oxygen atoms (O) than the dielectric layer D1, it is possible to suppress the movement of oxygen atoms in the dielectric layer DI. However, where the atomic percentage of the oxygen atoms of the first upper electrode UE1 is higher than about 70 at %, the first upper electrode UE1 may suffer from high resistance and this may lead to deterioration in capacitance property of the capacitor. By contrast, where the atomic percentage of the oxygen atoms of the first upper electrode UE1 is lower than about 15 at %, it may be difficult to effectively prevent the oxygen atoms from moving from the dielectric layer DI into the second upper electrode UE2.

In particular, extensive experimentations were carried out to test for optimal atomic percentage for the metallic element (M), the oxygen (O), and the nitrogen (N) for forming the first upper electrode UE1 having desired characteristics. Some examples of the experiments are described below.

For example, in certain experiments, a leakage current was measured for different oxygen contents of the first upper electrode UE1. In detail, oxygen-containing titanium oxynitrides (i.e., $Ti_xO_yN_z$) were used in the first, second, and third exemplary experiments, and an oxygen-free TiN sample was used in comparative exemplary experiment. In the titanium oxynitride of $Ti_xO_yN_z$ for the first, second, and third experiments, the content of oxygen was 10 at % (atomic percent) (e.g., x=30, y=10, z=60) in the first experiment, 38 at % (e.g., x=30, y=38, z=32) in the second embodiment, and 50 at % (e.g., x=30, y=50, z=20) in the third experiment. In the first experiment, the at % of the metal (Ti) was about three (3) times higher than the at % of the oxygen (O) and the at % of the nitrogen (N) was about six (times) higher than the at % of the oxygen (O). In the second experiment, the at % of oxygen (O) was slightly higher than both the at % of the metal (Ti) and the at % of the nitrogen (N). In the third experiment, the at % of oxygen (O) was about two (2) times higher than both the at % of the metal (Ti) and the at % of the nitrogen (N). The following Table 1 shows the leakage currents measured in the first to third experiments, when the leakage current measured in the comparative experiment is set as a reference value of 100.

TABLE 1

| Oxygen content | 0 at % (Comparative Experiment) | 10 at % (First Experiment) | 38 at % (Second Experiment) | 50 at % (Third Experiment) |
|---|---|---|---|---|
| Leakage current (relative value) | 100 | 83 | 52 | 14 |

Table 1 shows that the higher the oxygen content of the first upper electrode UE1, the lower the leakage current. In particular, as in the second experiment, when metal (Ti) and oxygen (O) had an atomic ratio close to 1:1, the leakage current was decreased to about half that of the comparative experiment. Also, as in the third experiment, when metal (Ti) and oxygen (O) had an atomic ratio close to 1:2, the leakage current was decreased to 14% of that of the comparative experiment. For example, the above result shows that it is possible to reduce the leakage current and thereby to improve capacitance of the capacitor, if the oxygen content of the first upper electrode UE1 is increased within a specific range. However, as described above, where the oxygen content is increased to about 70 at % or higher, the first upper electrode UE1 may suffer from high resistance and this may lead to deteriorated capacitance characteristics of the capacitor.

Figure 2:
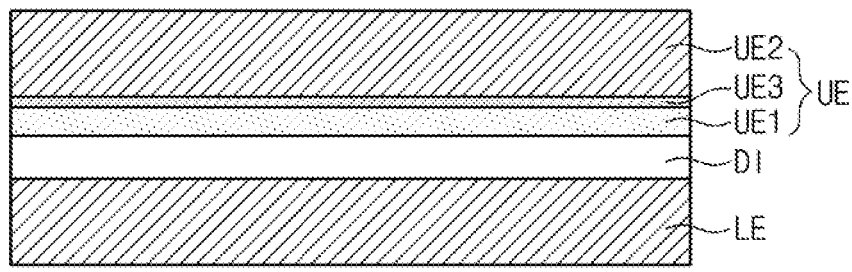
FIG. 2 is a sectional view illustrating a capacitor according to some embodiments of the inventive concept.

FIG. 2 is a sectional view illustrating a capacitor according to some embodiments of the inventive concept. For concise description, a previously described element may be identified by a similar or identical reference number without repeating an overlapping description thereof.

Referring to FIG. 2, the upper electrode UE may further include a third upper electrode UE3. The third upper electrode UE3 may be interposed between first and second upper electrodes UE1 and UE2. The third upper electrode UE3 may be configured to realize stable interfacial characteristics between the first and second upper electrodes UE1 and UE2.

In some embodiments, materials of the first and second upper electrodes UE1 and UE2 may be mixed with each other, and the third upper electrode UE3 may be formed as a result of such a mixing of the materials. For example, the third upper electrode UE3 may contain metal oxynitride, whose oxygen content is lower than that of the first upper electrode UE1 and higher than that of the second upper electrode UE2 (e.g., the oxygen content of the upper electrode UE2 in this example as well as in FIG. 1 maybe zero or near zero, or may have another value lower than the oxygen content of the first upper electrode UE1 or the third upper electrode UE3). The third upper electrode UE3 may contain the same metallic element as the metallic element (M) of the first upper electrode UE1. For example, the third upper electrode UE3 may be formed of or include titanium oxynitride.

Figure 3:
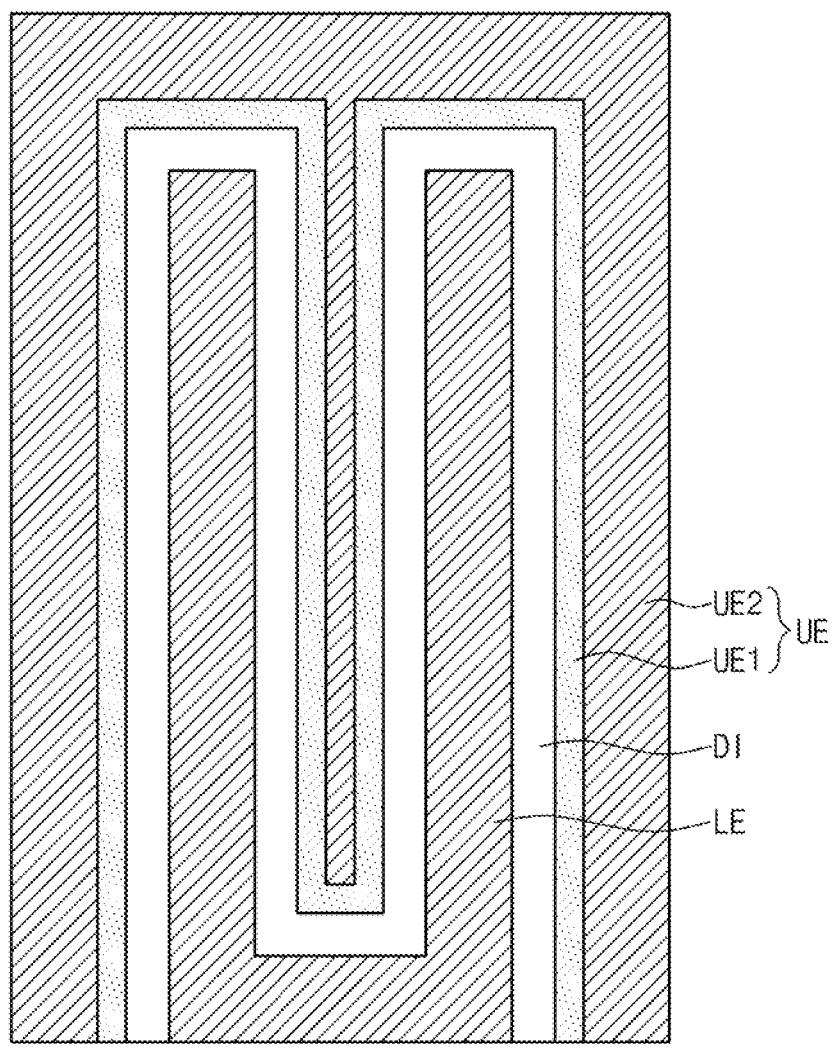
FIG. 3 is a sectional view illustrating a capacitor according to some embodiments of the inventive concept.

FIG. 3 is a sectional view illustrating a capacitor according to some embodiments of the inventive concept. For concise description, a previously described element may be identified by a similar or identical reference number without repeating an overlapping description thereof.

Referring to FIG. 3, in some embodiments, the lower electrode LE may be provided to have a bottom-closed hollow cylindrical structure. For example, where the lower electrode LE has a cylindrical structure, all of top, outer-side, and inner-side surfaces of the lower electrode LE can be used to store electric charges. For example, where the lower electrode LE having a three-dimensional structure is used, it is possible to increase an effective area, and consequently capacitance, of the capacitor.

In some embodiments, the dielectric layer DI may be provided to conformally cover the inner and outer side surfaces of the lower electrode LE. The dielectric layer DI may cover top surfaces of the lower electrode LE as well. In some embodiments, the dielectric layer DI may be provided to be thin enough to allow an unfilled space to remain in the lower electrode LE.

The first upper electrode UE1 may be conformally provided on the dielectric layer DI. It should be noted that the dielectric layer DI and first upper electrode UE1 described in FIGS. 1 and 2 may also be described as being conformally formed on the lower electrode LE. Returning to FIG. 3, the first upper electrode UE1 may be provided to be thin enough to allow an unfilled space to remain in the lower electrode LE provided with the dielectric layer DI. For example, the second upper electrode UE2 may be provided on the first upper electrode UE1 to fill the inner space of the lower electrode LE provided with the first upper electrode UE1. The second upper electrode UE2 may cover the lower electrode LE, dielectric layer DI, and first upper electrode UE1.

In certain embodiments, as illustrated in FIG. 2, the third upper electrode UE3 may be further provided between the first and second upper electrodes UE1 and UE2. Furthermore, the shape of the lower electrode LE may be variously changed; for example, the lower electrode LE may be provided to have one of pillar-shaped, stack-shaped, or concave structures.

Figure 4:
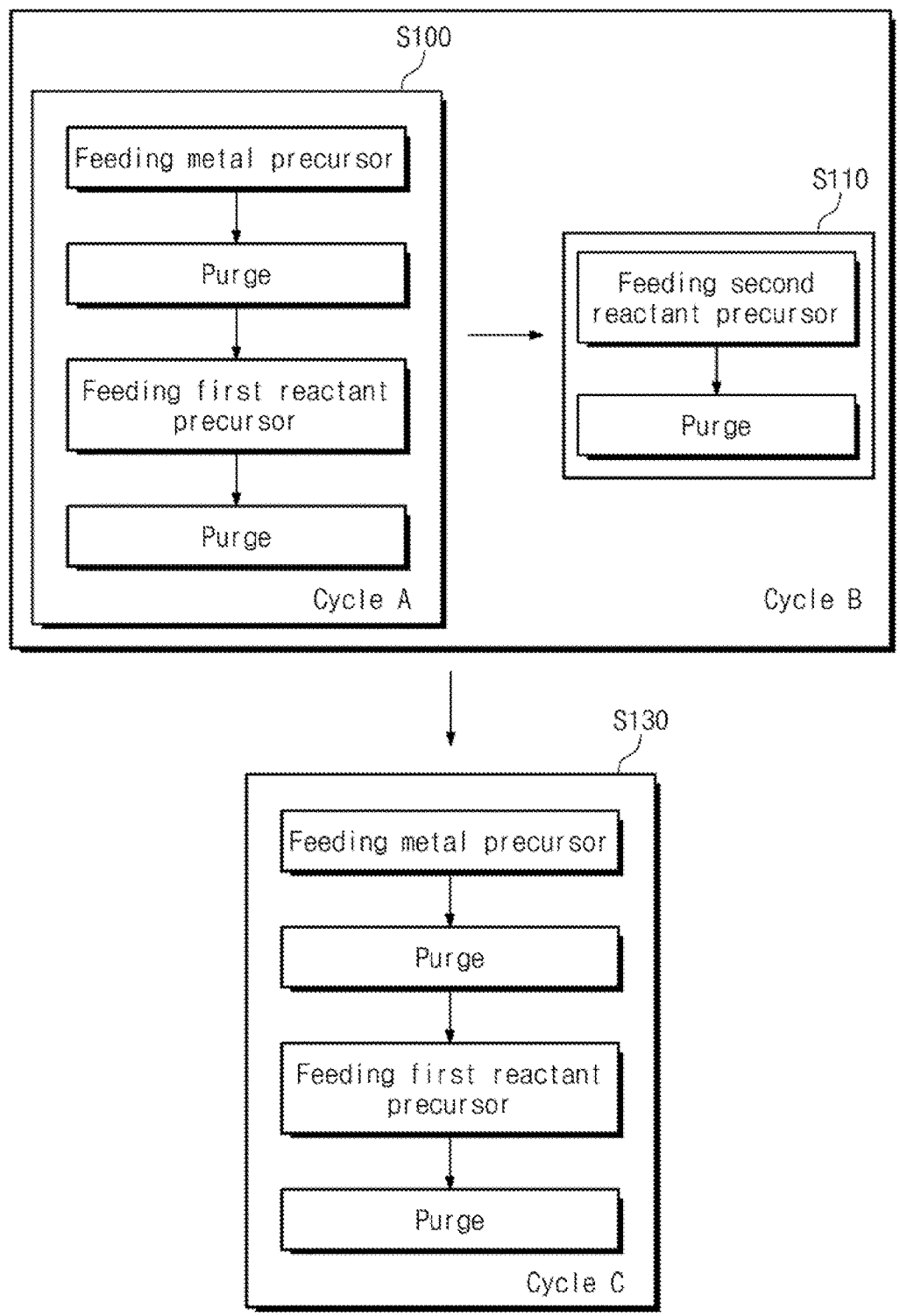
FIG. 4 is a flow chart illustrating a method of forming a capacitor, according to some embodiments of the inventive concept.
Figure 5A:
FIGS. 5A through 5D are sectional views illustrating a method of fabricating a capacitor, according to some embodiments of the inventive concept.
Figure 5B:
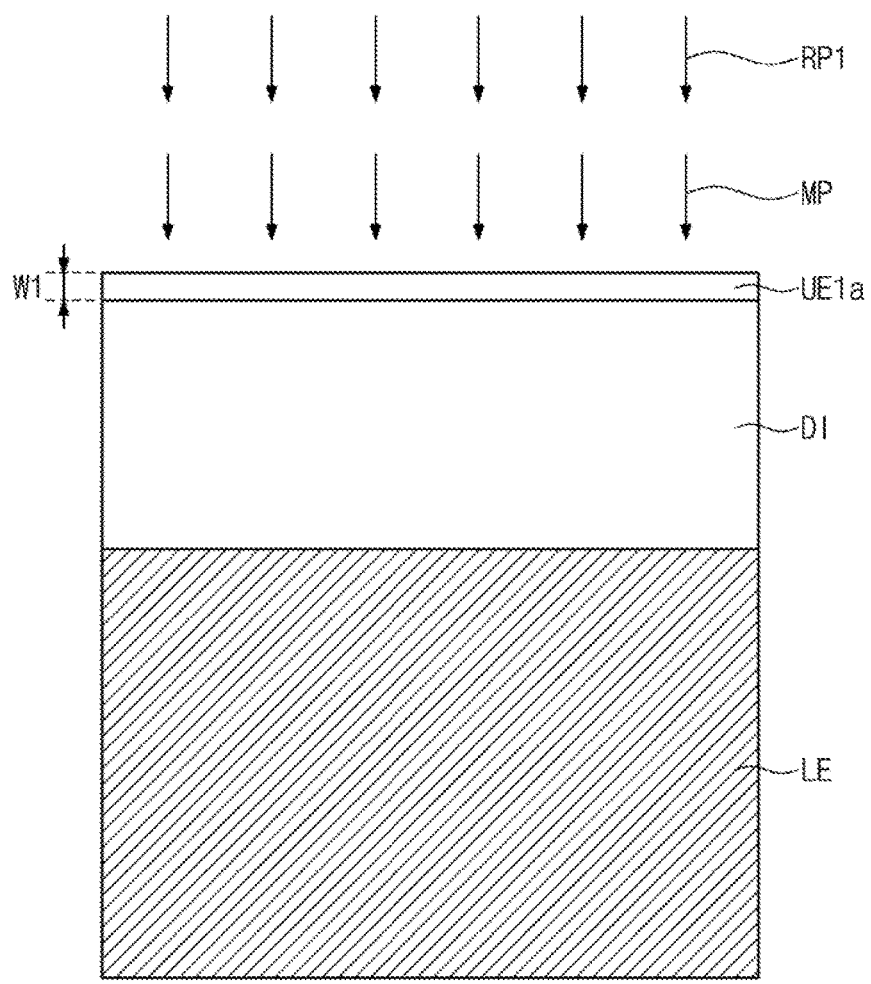
Figure 5C:
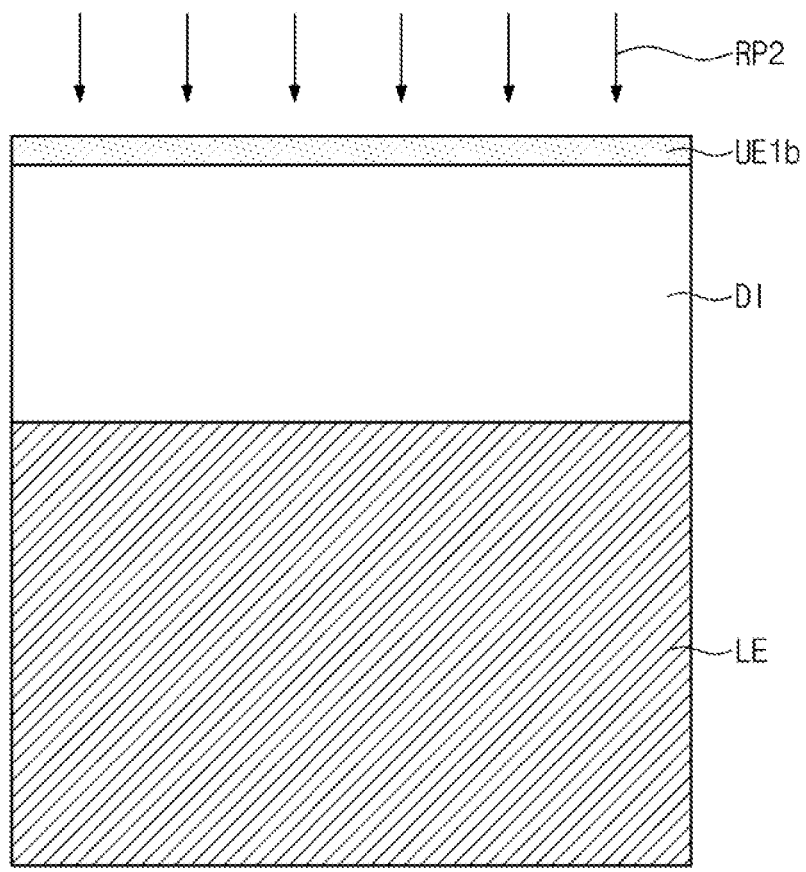
Figure 5D:
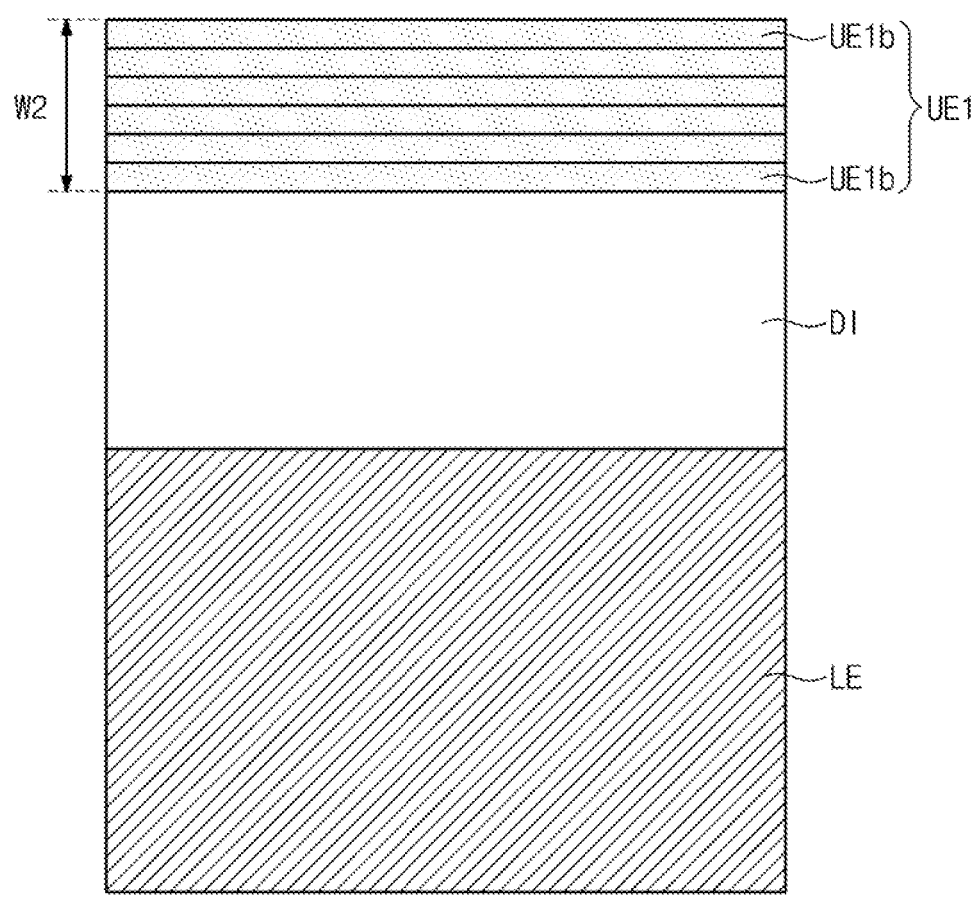

FIG. 4 is a flow chart illustrating a method of forming a capacitor, according to some embodiments of the inventive concept, and FIGS. 5A through 5D are sectional views illustrating a method of fabricating a capacitor, according to some embodiments of the inventive concept. FIGS. 5B through 5D are enlarged sectional views of FIG. 5A. For concise description, an element previously described with reference to FIG. 1 may be identified by a similar or identical reference number without repeating an overlapping description thereof.

Referring to FIG. 5A, a lower electrode LE and a dielectric layer DI may be sequentially formed. The lower electrode LE may be formed of at least one of, for example, doped silicon, metals, metal nitrides, or metal silicides, and the dielectric layer DI may be formed of at least one of high-k dielectric materials. One or both of the lower electrode LE and the dielectric layer DI may be formed by one of, for example, PVD, CVD, and ALD processes. The lower electrode LE and dielectric layer DI may be formed, for example, on a semiconductor substrate.

Referring to FIGS. 4 and 5B, a preliminary sub electrode UE1a may be formed on the dielectric layer DI by, for example, an ALD process (in S100). The ALD process may be performed in an in-situ manner. For example, the first and second upper electrodes UE1 and UE2 may be sequentially formed in the same chamber, without a vacuum break.

The formation of the preliminary sub electrode UE1a may include performing a first cycle A. The first cycle A may include feeding a metal precursor MP into the chamber, purging the chamber with inert gas, feeding a first reactant precursor RP1 into the chamber, and then, purging the chamber with inert gas.

In some embodiments, the metal precursor MP may contain one of titanium (Ti), zirconium (Zr), aluminum (Al), hafnium (Hf), tantalum (Ta), niobium (Nb), yttrium (Y), lanthanum (La), vanadium (V), and manganese (Mn) precursors. As an example, the metal precursor MP may contain a titanium (Ti) precursor (such as $TiCl_4$).

In some embodiments, the first reactant precursor RP1 may contain a nitrogen (N) precursor. The nitrogen (N) precursor may react with the metal precursor MP, thereby forming a metal nitride layer. For example, the nitrogen (N) precursor may contain $NH_3$.

In some embodiments, the inert gas may contain at least one of nitrogen ($N_2$), helium (He), neon (Ne), argon (Ar), or xenon (Xe).

In some embodiments, every time the first cycle A is performed, an atomic layer containing metal reactant may be formed on the dielectric layer DI. The metal reactant may result from the reaction between the metal precursor MP and the first reactant precursor RP1. For example, the metal reactant may be titanium nitride (TiN).

If the first cycle A is repeated n times (where n is an integer of 1 or larger), the preliminary sub electrode UE1a may be formed to have a first thickness W1. For example, the atomic layers containing the metal reactant may be stacked to form the preliminary sub electrode UE1a. Accordingly, by changing the value of n, it is possible to control the first thickness W1 of the preliminary sub electrode UE1a. In some embodiments, the value n may be selected within a range from 1 to 10. The first thickness W1 may range from about 1 Å to about 10 Å. For example, the first thickness W1 may have an amount or value selected from a range between about 1 Å to about 10 Å. The thickness may be a uniform thickness throughout the preliminary sub electrode UE1a.

Referring to FIGS. 4 and 5C, in some embodiments, a second reactant precursor RP2 may be supplied on the preliminary sub electrode UE1a to form a sub electrode UE1b (in S110). For example, the formation of the sub electrode UE1b may include performing a second cycle B. The second cycle B may include performing the first cycle A, feeding the second reactant precursor RP2 into the chamber, and purging the chamber with inert gas.

In some embodiments, the second reactant precursor RP2 may contain an oxygen (O) precursor. The oxygen precursor may react with the metal reactant on the preliminary sub electrode UE1a to form a layer of metal oxynitride ($M_xO_yN_z$). For example, the oxygen precursor may break a bonding between the metallic elements (M) and the nitrogen atoms in the metal reactant and create a new bonding between the metallic elements (M) and the oxygen atoms. For example, a part of the nitrogen atoms in the metal reactant may be replaced with the oxygen atoms in the oxygen precursor. In some embodiments, the oxygen precursor may be $O_2$.

In some embodiments, every time the second cycle B is performed, the sub electrode UE1b including the metal oxynitride ($M_xO_yN_z$) may be formed on the dielectric layer DI. In some embodiments, the metal oxynitride ($M_xO_yN_z$) may be titanium oxynitride ($Ti_xO_yN_z$).

Where the thickness W1 of the preliminary sub electrode UE1a is greater than 10 Å, it may be difficult for the entire portion of the preliminary sub electrode UE1a to react uniformly with the second reactant precursor RP2 (i.e., the oxygen precursor). For example, the oxygen concentration may decrease in a direction from a top surface toward a bottom surface of the sub electrode UE1b. Alternatively, where the thickness W1 of the preliminary sub electrode UE1a is smaller than 10 Å, the oxygen concentration in the sub electrode UE1b may be uniform (e.g., in a direction from a top surface toward a bottom surface of the sub electrode UE1b).

In some embodiments, by changing the repetition number (n) of the first cycle A (i.e., the thickness W1 of the preliminary sub electrode UE1a), it is possible to control a concentration of the second reactant (i.e., oxygen) in the sub electrode UE1b. For example, where it is useful to increase the oxygen concentration of the sub electrode UE1b, the repetition number (n) of the first cycle A may be decreased to reduce the thickness W1 of the preliminary sub electrode UE1a, and then, the oxygen precursor may be supplied. By contrast, where it is useful to decrease the oxygen concentration of the sub electrode UE1b, the repetition number of the first cycle A may be increased and then the oxygen precursor may be supplied. In this embodiment, the oxygen concentration varies in inverse proportion to the repetition number.

In some embodiments, the oxygen concentration of the sub electrode UE1b may also be changed by controlling other process condition in the process of supplying the oxygen precursor. For example, a mixture gas of the oxygen precursor and a carrier gas may be used to supply the oxygen precursor into the chamber. Here, a partial pressure of the oxygen precursor in the mixture gas may range from about 300 mTorr to about 2 Torr. Temperature of the chamber may be controlled to be within a range from about 100° C. to about 550° C. Where it is useful to increase the oxygen concentration of the sub electrode UE1b, the partial pressure of the oxygen precursor may be increased and the temperature of the chamber may be increased. Alternatively, where it is useful to decrease the oxygen concentration of the sub electrode UE1b, the partial pressure of the oxygen precursor may be decreased and the temperature of the chamber may be decreased.

In some embodiments, in the sub electrode UE1b, the atomic percent of the metallic element (M) may range from about 30 at % to about 40 at %, the atomic percent of the oxygen (O) may range from about 15 at % to about 70 at %, and the atomic percent of the nitrogen (N) may range from about 0 at % to about 55 at %. In some embodiments, an atomic ratio (y/x) between oxygen (O) and metallic element (M) may be controlled to be within a range from about 0.5 to about 2.

Referring to FIGS. 4 and 5D, in some embodiments, by repeating m times the second cycle B (where m is an integer of 1 or larger), the first upper electrode UE1 with a second thickness W2 may be formed on the dielectric layer DI. The first upper electrode UE1 may include m sub electrodes UE1b, which are sequentially stacked on the dielectric layer DI.

In some embodiments, by changing the value of m, it is possible to control the second thickness W2 of the first upper electrode UE1. In some embodiments, the value of m may be selected in a range from 1 to 10. The second thickness W2 may range from about 1 Å to about 50 Å. Since the first upper electrode UE1 includes a plurality of sub electrodes UE1b, each of which is formed each time the second cycle B, the first upper electrode UE1 may be formed to have uniform contents of metallic element (M), oxygen (O), and nitrogen (N). A first upper electrode UE1 such as shown in FIG. 5C or 5D may be included in capacitor, such as shown in any of FIGS. 1-3.

Referring back to FIGS. 4 and 1, in some embodiments, the second upper electrode UE2 may be formed on the first upper electrode UE1 by, for example, an ALD process (in S130). In some embodiments, the formation of the second upper electrode UE2 may include performing a third cycle C. The third cycle C may include feeding a metal precursor MP into the chamber, purging the chamber with inert gas, feeding a first reactant precursor RP1 into the chamber, and purging the chamber with inert gas. In some embodiments, the third cycle C may be performed in a similar manner to that of the first cycle A.

Referring back to the first cycle A, every time the first cycle A is performed, an atomic layer containing metal reactant may be formed on the dielectric layer DI. In some embodiments, the metal reactant may be, for example, titanium nitride (TiN). However, a metal precursor, which is different from that for the first cycle A, may be used for the third cycle C, but it is not limited thereto.

In some embodiments, by repeating p times the third cycle C (where p is an integer of 1 or larger), the second upper electrode UE2 may be formed on the first upper electrode UE1. For example, the atomic layers containing the metal reactant may be stacked to form the second upper electrode UE2. By changing the value of p, it is possible to control a thickness of the second upper electrode UE2. In some embodiments, the second upper electrode UE2 may be formed to be thicker than the first upper electrode UE1. As an example, the second upper electrode UE2 may be formed to have a thickness ranging from about 10 Å to about 100 Å. For example, the first thickness may have an amount or value selected from a range between about 10 Å to about 100 Å. The thickness may be a uniform thickness throughout the second upper electrode UE2.

In certain embodiments, unlike the first upper electrode UE1, the second upper electrode UE2 may be formed by a CVD process.

Figure 6:
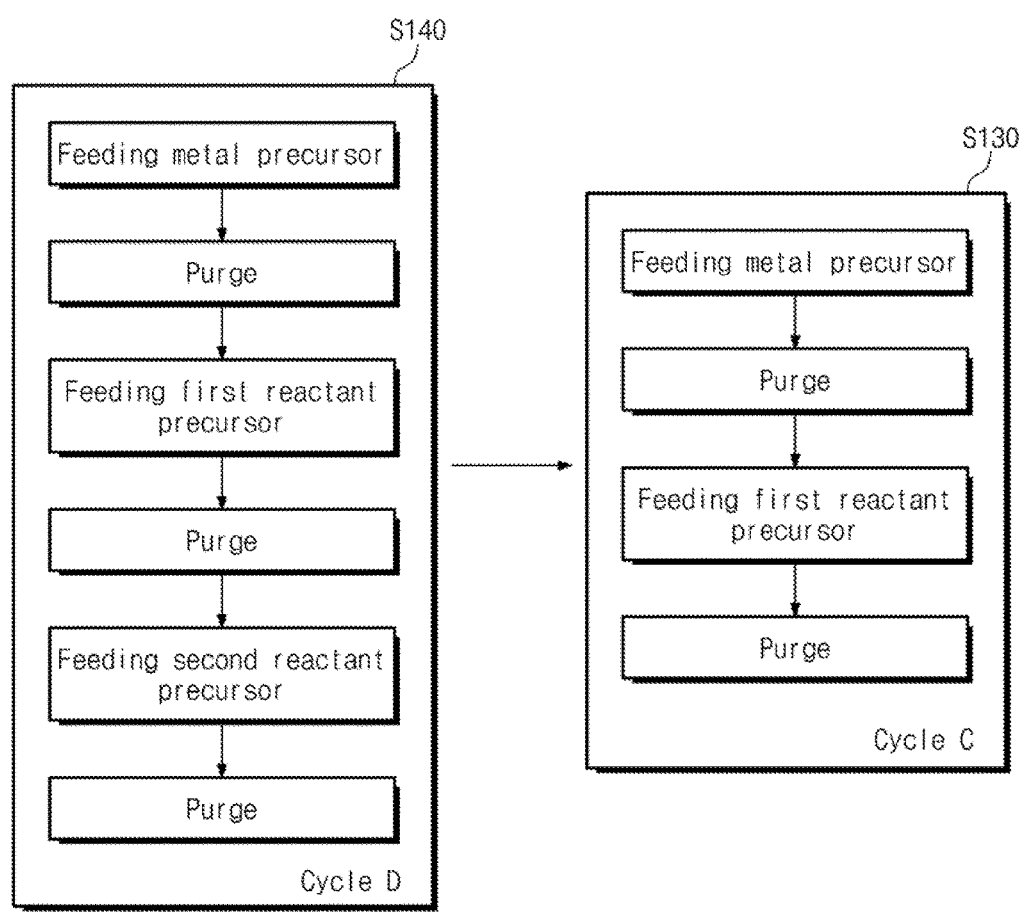
FIG. 6 is a flow chart illustrating a method of forming a capacitor, according to some embodiments of the inventive concept.
Figure 7:
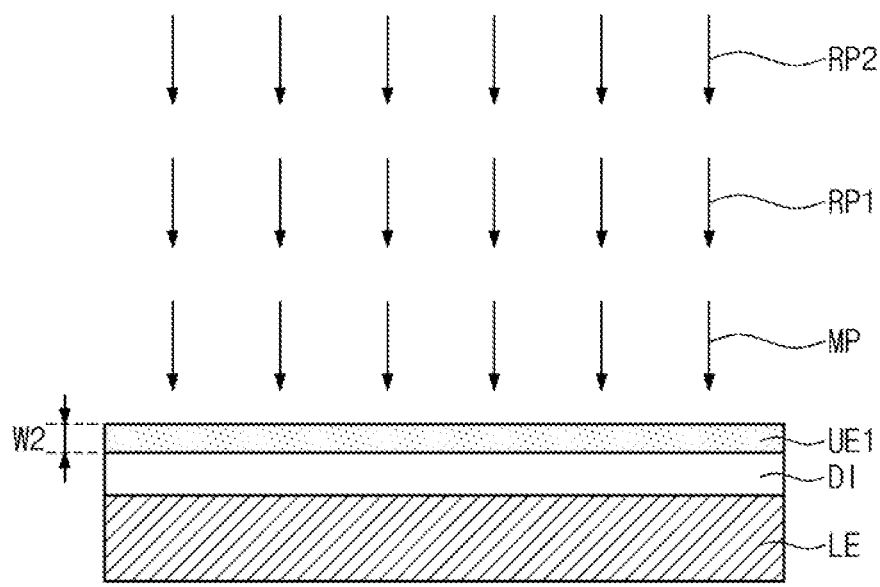
FIG. 7 is a sectional view illustrating a method of forming a capacitor, according to some embodiments of the inventive concept.

FIG. 6 is a flow chart illustrating a method of forming a capacitor, according to some embodiments of the inventive concept, and FIG. 7 is a sectional view illustrating a method of forming a capacitor, according to some embodiments of the inventive concept. For concise description, an element or step of a fabrication method previously described with reference to FIG. 4 and FIGS. 5A through 5D may be identified by a similar or identical reference number without repeating an overlapping description thereof.

Referring to FIGS. 6 and 7, in some embodiments, the first upper electrode UE1 may be formed on the resulting structure of FIG. 5A. The first upper electrode UE1 may be formed on the dielectric layer DI by, for example, an ALD process (in S140). In some embodiments, the formation of the first upper electrode UE1 may include performing a fourth cycle D. For example, the fourth cycle D may include feeding a metal precursor MP into the chamber, purging the chamber with inert gas, feeding a first reactant precursor RP1 into the chamber, purging the chamber with inert gas, feeding a second reactant precursor RP2 into the chamber, and purging the chamber with inert gas. In some embodiments, the metal precursor MP, the first reactant precursor RP1 (e.g., nitrogen (N) precursor), and the second reactant precursor RP2 (e.g., oxygen (O) precursor) may be prepared to have substantially the same features as those described with reference to FIG. 4 and FIGS. 5A through 5D.

Every time the fourth cycle D is performed, an atomic layer containing metal oxynitride ($M_xO_yN_z$) may be formed on the dielectric layer DI. In some embodiments, the metal oxynitride ($M_xO_yN_z$) may be, for example, titanium oxynitride ($Ti_xO_yN_z$).

In some embodiments, if the fourth cycle D is repeated q times (where q is an integer of 1 or larger), the first upper electrode UE1 may be formed to have a second thickness W2. For example, the atomic layers containing the metal oxynitride ($M_xO_yN_z$) may be stacked to form the first upper electrode UE1. The second thickness W2 of the first upper electrode UE1 may be controlled by changing the value of q.

Unlike that of FIG. 4 and FIGS. 5A through 5D, in some embodiments, the metal precursor MP, the nitrogen precursor, and the oxygen precursor may be supplied into the chamber every cycle (e.g., rather than performing a plurality of nitrogen precursor cycles, and then performing an oxygen precursor cycle on the layers formed by the plurality of nitrogen precursor cycles). Accordingly, it may be possible to increase the oxygen concentration of the first upper electrode UE1. In some embodiments, the oxygen concentration of the first upper electrode UE1 may be changed by controlling other process condition in the process of supplying the oxygen precursor. The process condition, therefore, may be substantially the same as that described with reference to FIGS. 4 and 5C.

Referring back to FIGS. 6 and 1, in some embodiments, the second upper electrode UE2 may be formed on the first upper electrode UE1 by, for example, an ALD process (in S130). The formation of the second upper electrode UE2 may include performing the third cycle C, and in some embodiments, the third cycle C may be performed in the same manner as that described with reference to FIGS. 4 and 1.

FIGS. 8A through 13A are plan views illustrating a method of fabricating a semiconductor device, according to some embodiments of the inventive concept, and FIGS. 8B through 13B are sectional views taken along lines I-I' of FIGS. 8A through 13A, respectively. The inventive concept will be described with reference to an example, in which the semiconductor device is a dynamic random access memory (DRAM) device, but the inventive concept is not limited thereto. For concise description, an element or step of a fabrication method previously described with reference to FIG. 4 and FIGS. 5A through 5D may be identified by a similar or identical reference number without repeating an overlapping description thereof.

Figure 8A:
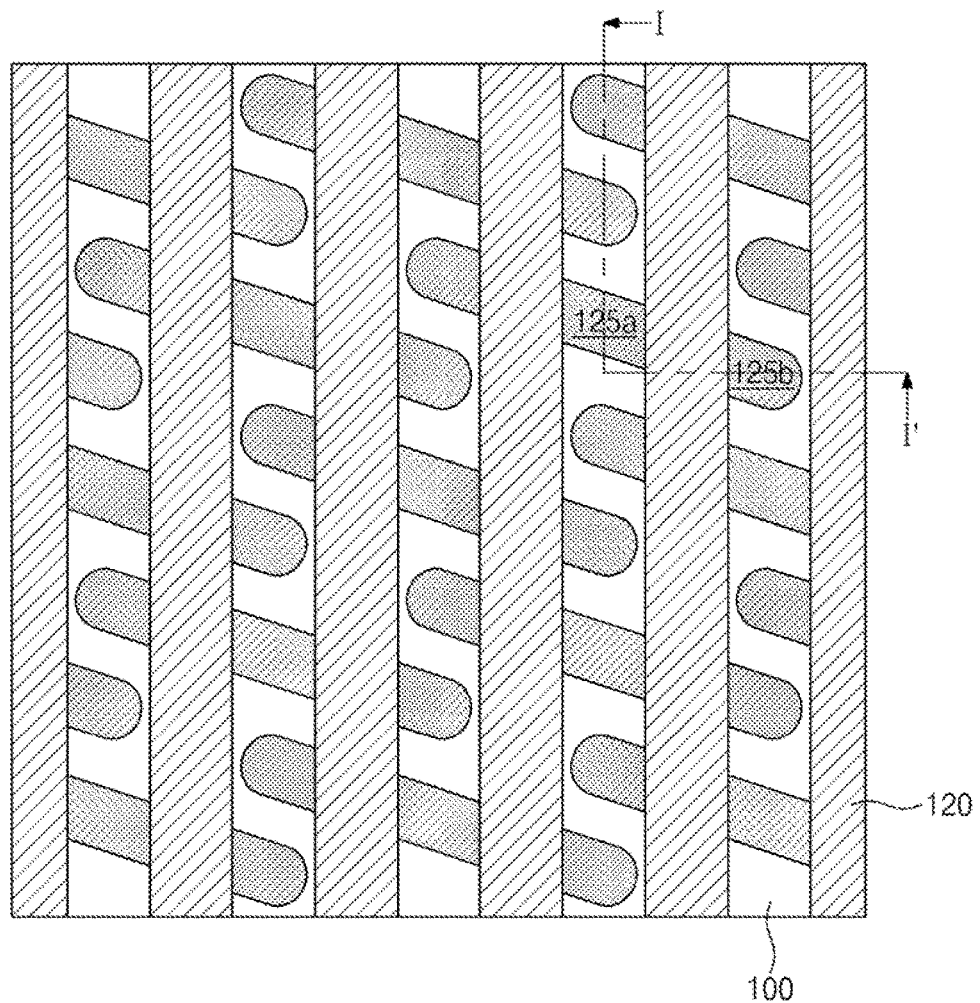
Figure 8B:
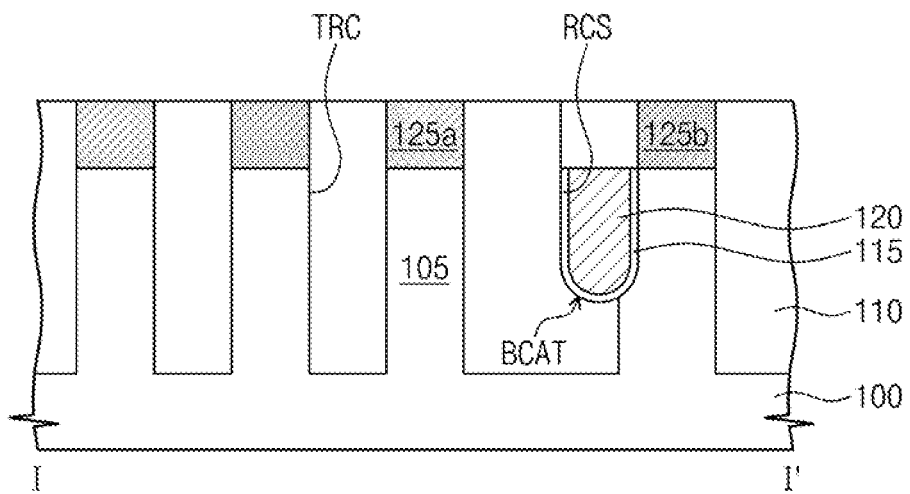

Referring to FIGS. 8A and 8B, in some embodiments, transistors BCAT (buried channel array transistor) may be formed on a substrate 100, and the transistors BCAT may include gate electrodes 120 extending in a specific direction. The substrate 100 may be a semiconductor substrate including, for example, silicon, germanium, or silicon/germanium, a silicon-on-insulator (SOI) wafer, or a germanium-on-insulator (GOI) wafer. The substrate 100 may be etched to form a trench TRC, and an insulating material may be formed in the trench TRC to form a device isolation pattern 110 defining active regions 105. The device isolation pattern 110 may be formed of or include at least one of silicon oxide, silicon nitride, or silicon oxynitride.

In some embodiments, the formation of the gate electrodes 120 may include forming recesses RCS to cross the device isolation pattern 110 and the active regions 105 in the specific direction, forming a gate insulating layer 115 to conformally cover an inner side surface of each of the recesses RCS, and then, filling the recesses RCS provided with the gate insulating layer 115 with a conductive material. The gate insulating layer 115 may be formed of or include a silicon oxide layer, and the conductive material may be formed of or include a doped silicon layer. In some embodiments, each of the gate electrodes 120 may be covered with a capping layer.

In some embodiments, first and second impurity regions 125a and 125b may be formed by injecting impurities into portions of the active regions 105 positioned at both sides of each of the gate electrodes 120. According to the aforedescribed method, the transistor is formed to have a channel region buried in the substrate 100, and thus, it may be called a "buried channel array transistor (BCAT)".

In certain embodiments, the gate insulating layer 115 and a conductive layer (not shown) may be sequentially formed on the substrate 100 provided with the device isolation pattern 110 and the active regions 105, and then, the conductive layer may be patterned to form the gate electrodes 120 extending in the specific direction. Thereafter, the first and second impurity regions 125a and 125b may be formed by injecting impurities into portions of the active regions 105 positioned at both sides of each of the gate electrodes 120.

In certain embodiments, the substrate 100 may be etched to form fin-shaped active regions 105, and the device isolation pattern 110 may be formed to cover lower portions of the active regions 105. The gate insulating layer 115 and a conductive layer may be formed on the active regions 105, and the conductive layer may be patterned to form the gate electrodes 120 extending in a direction crossing the active regions 105. In some embodiments, the active regions 105 exposed by the gate electrodes 120 may be etched, and then, an epitaxial process may be performed to form epitaxial patterns serving as the first and second impurity regions 125a and 125b. Alternatively, after the formation of the first and second impurity regions 125a and 125b, a replacement process may be performed to replace the gate electrodes 120 with a metal-containing material.

Although BCAT-type transistors are exemplarily illustrated in FIGS. 8A and 8B, the transistor, to which the inventive concept can be applied, is not limited thereto.

Figure 9A:
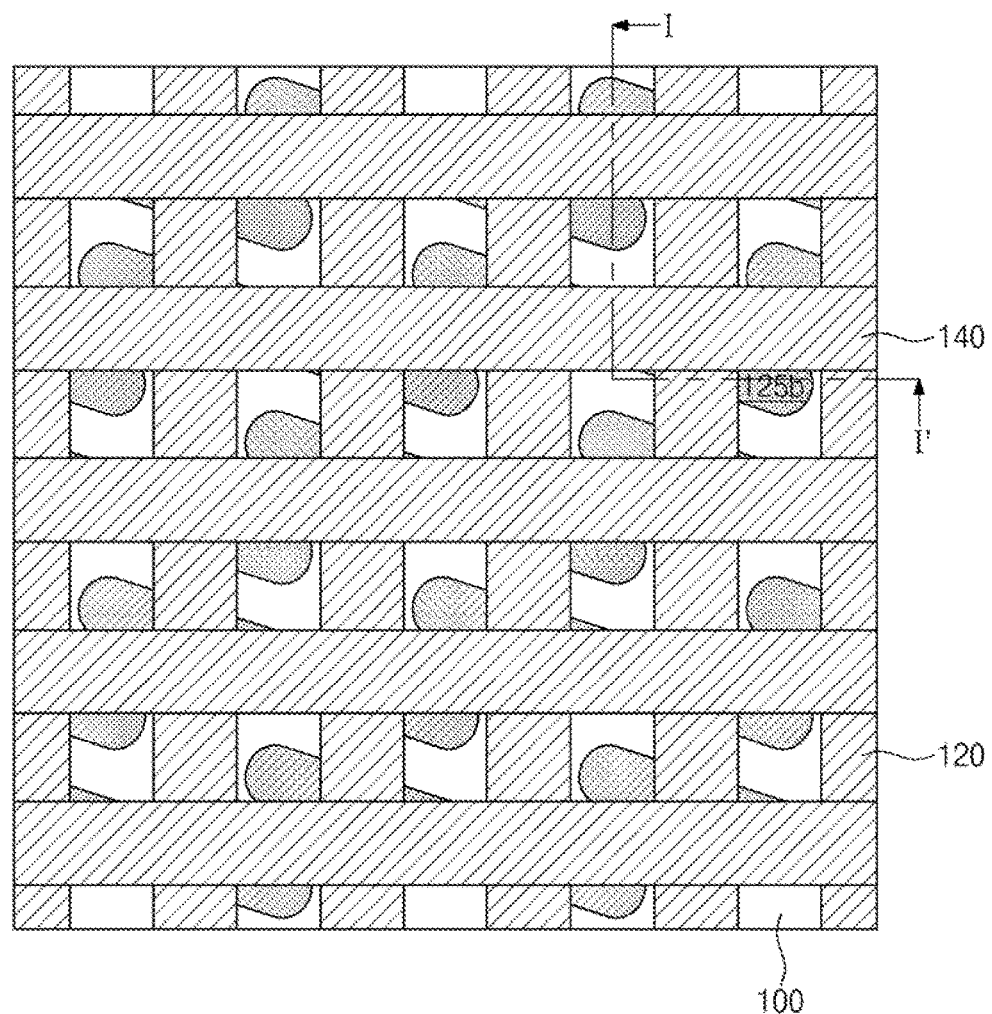
Figure 9B:
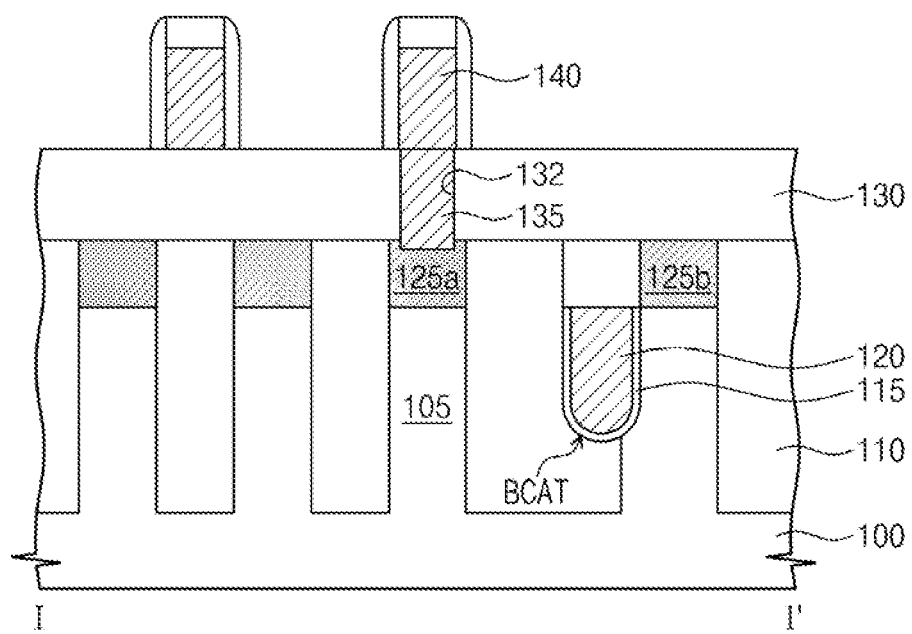

Referring to FIGS. 9A and 9B, bit lines 140 may be formed on the substrate 100 to cross the gate electrodes 120.

For example, a first interlayered insulating layer 130 may be formed on the substrate 100 to cover the transistors BCAT, and then, may be etched to form first contact holes 132 exposing the first impurity regions 125a. The first interlayered insulating layer 130 may be formed of or include, for example, at least one of silicon oxide, silicon nitride, or silicon oxynitride. First contact plugs 135 may be formed by filling the first contact holes 132 with a conductive material. The conductive material may include at least one of metal silicides. A conductive layer (not shown) may be formed on the first interlayered insulating layer 130 provided with the first contact plugs 135 and may be patterned to form the bit lines 140. The conductive layer may be formed of or include a metallic material (e.g., tungsten). Furthermore, a capping layer and spacers may be formed to cover top and side surfaces of each of the bit lines 140.

Figure 10A:
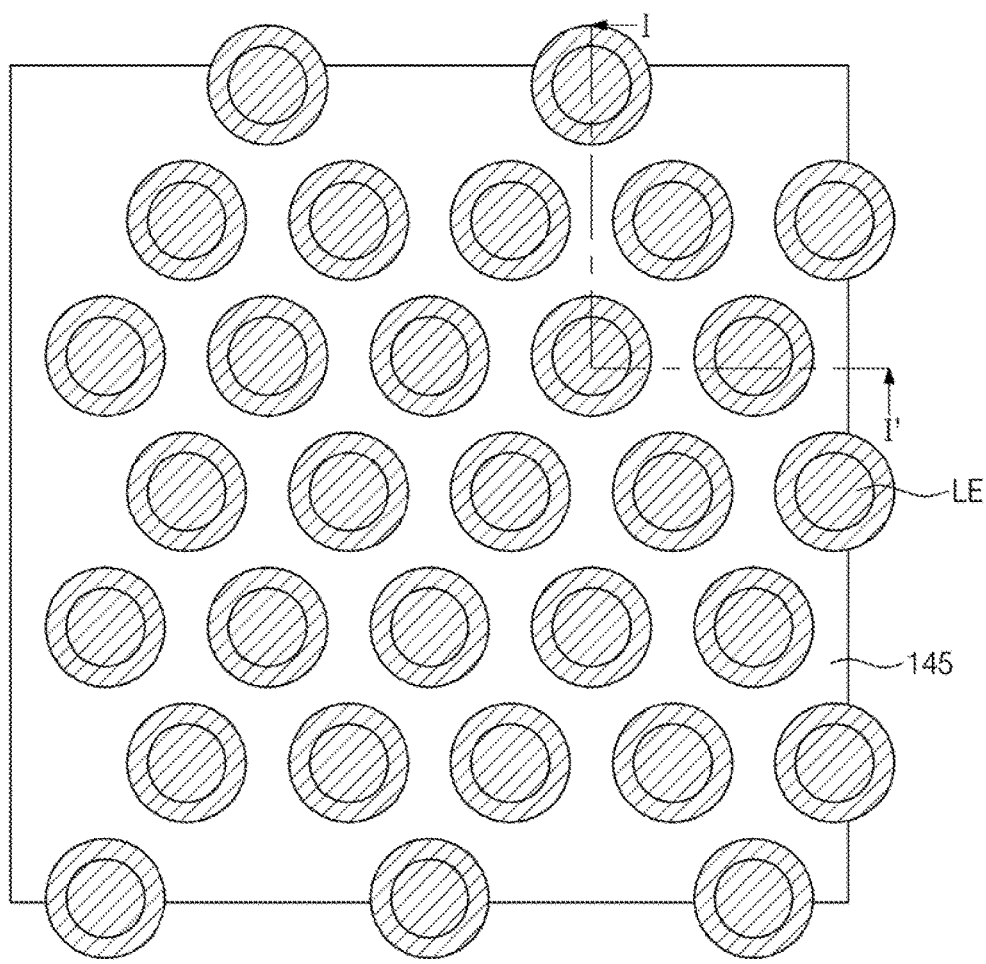
Figure 10B:
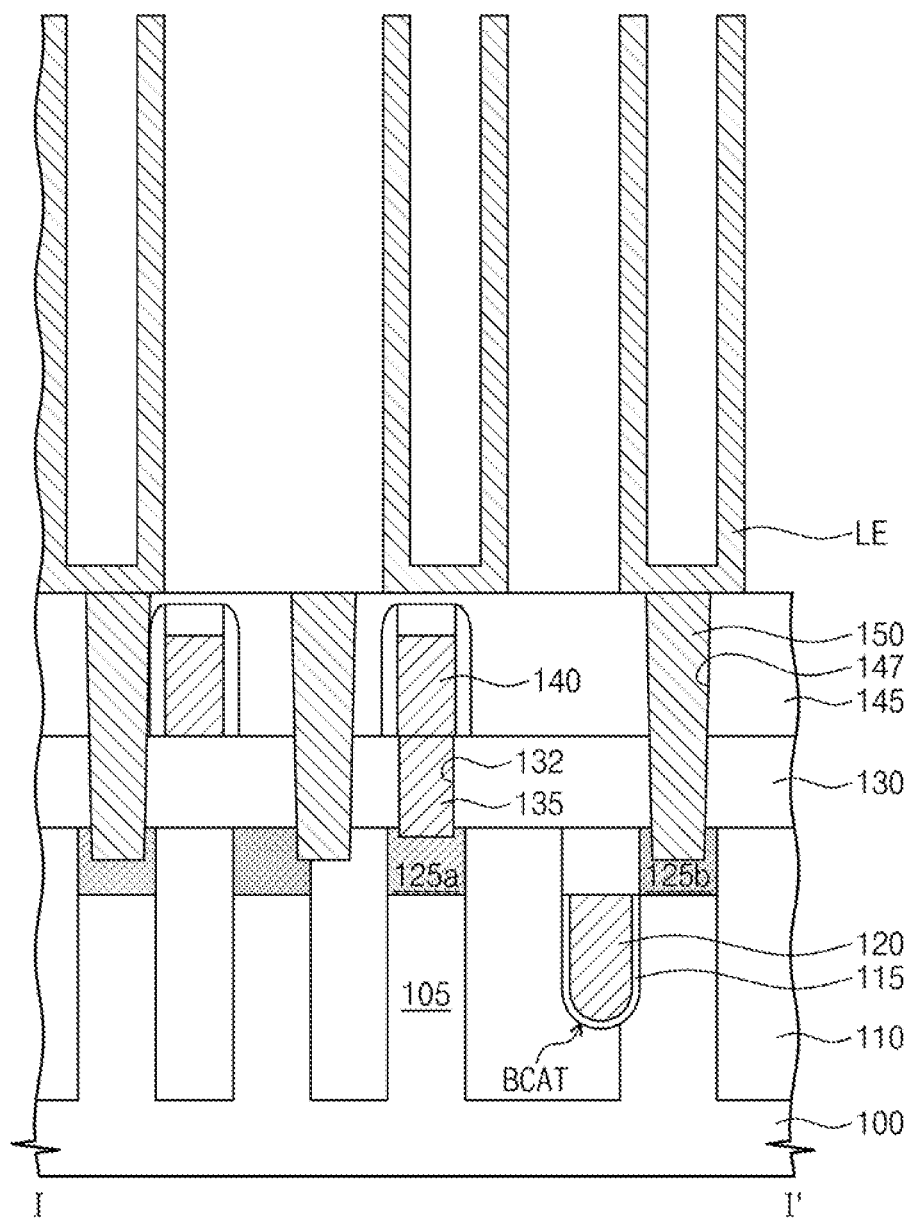

Referring to FIGS. 10A and 10B, in some embodiments, lower electrodes LE may be formed on the substrate 100 and may be connected to the transistors BCAT, respectively.

In some embodiments, a second interlayered insulating layer 145 may be formed on the first interlayered insulating layer 130 to cover the bit lines 140, and the first and second interlayered insulating layers 130 and 145 may be etched to form second contact holes 147 exposing the second impurity regions 125b. The second interlayered insulating layer 145 may be formed of or include at least one of silicon oxide, silicon nitride, or silicon oxynitride.

In some embodiments, second contact plugs 150 may be formed by filling the second contact holes 147 with a conductive material. A first sacrificial layer (not shown) may be formed on the second interlayered insulating layer 145 provided with the second contact plugs 150. The first sacrificial layer may be formed of or include at least one of silicon oxide, silicon nitride, or silicon oxynitride.

In some embodiments, the first sacrificial layer may be etched to form third contact holes (not shown) respectively exposing the second contact plugs 150. A lower electrode layer may be conformally formed on the second interlayered insulating layer 145 with the third contact holes. In some embodiments, the lower electrode layer may be formed of or include titanium or titanium nitride.

In some embodiments, the third contact holes provided with the lower electrode layer may be filled with a second sacrificial layer (not shown). The second sacrificial layer may be formed of or include at least one of silicon oxide, silicon nitride, or silicon oxynitride. A planarization process may be performed on the second sacrificial layer and the lower electrode layer to expose a top surface of the first sacrificial layer, and thus, each of the lower electrodes LE may be formed to have a bottom-closed cylindrical structure.

After the formation of the lower electrodes LE, the first and second sacrificial layers may be completely removed to expose inner and outer side surfaces of each of the lower electrodes LE.

Although not shown, in some embodiments, where the lower electrodes LE are provided to have high aspect ratio, at least one supporter may be further formed to prevent the lower electrodes LE from leaning.

Figure 11A:
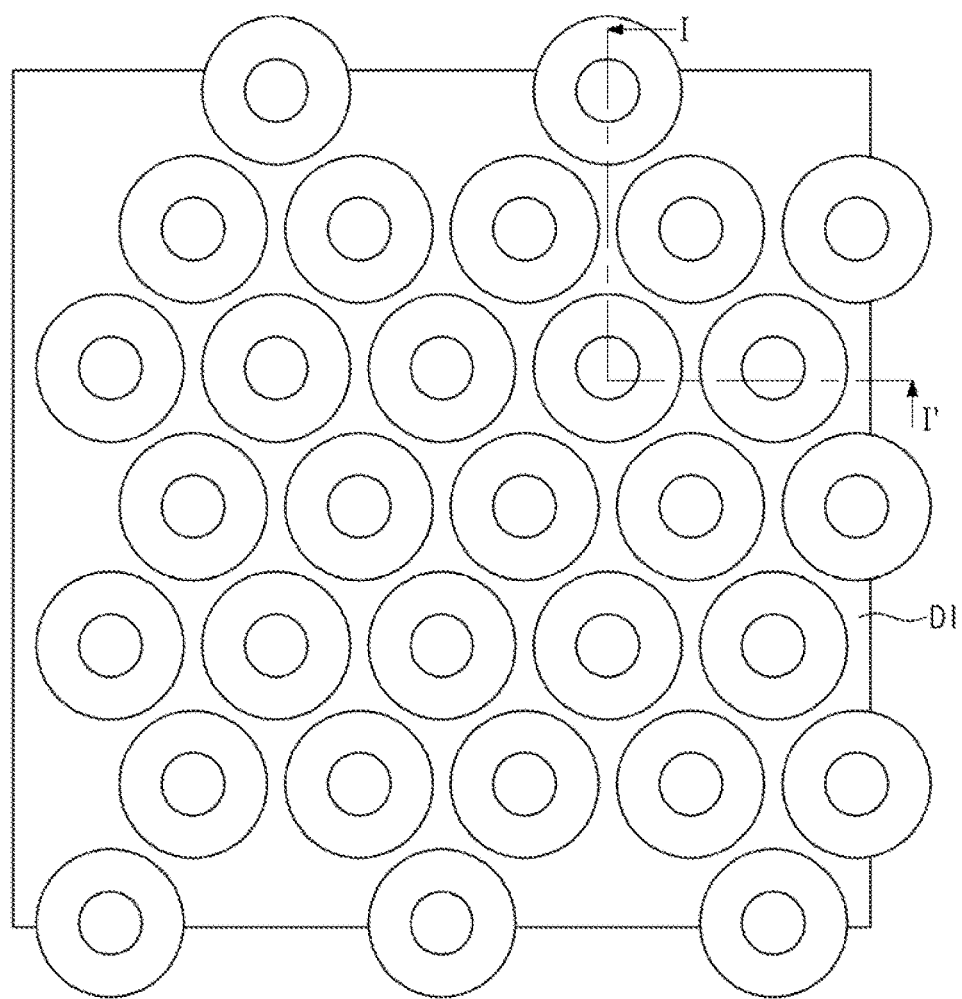
Figure 11B:
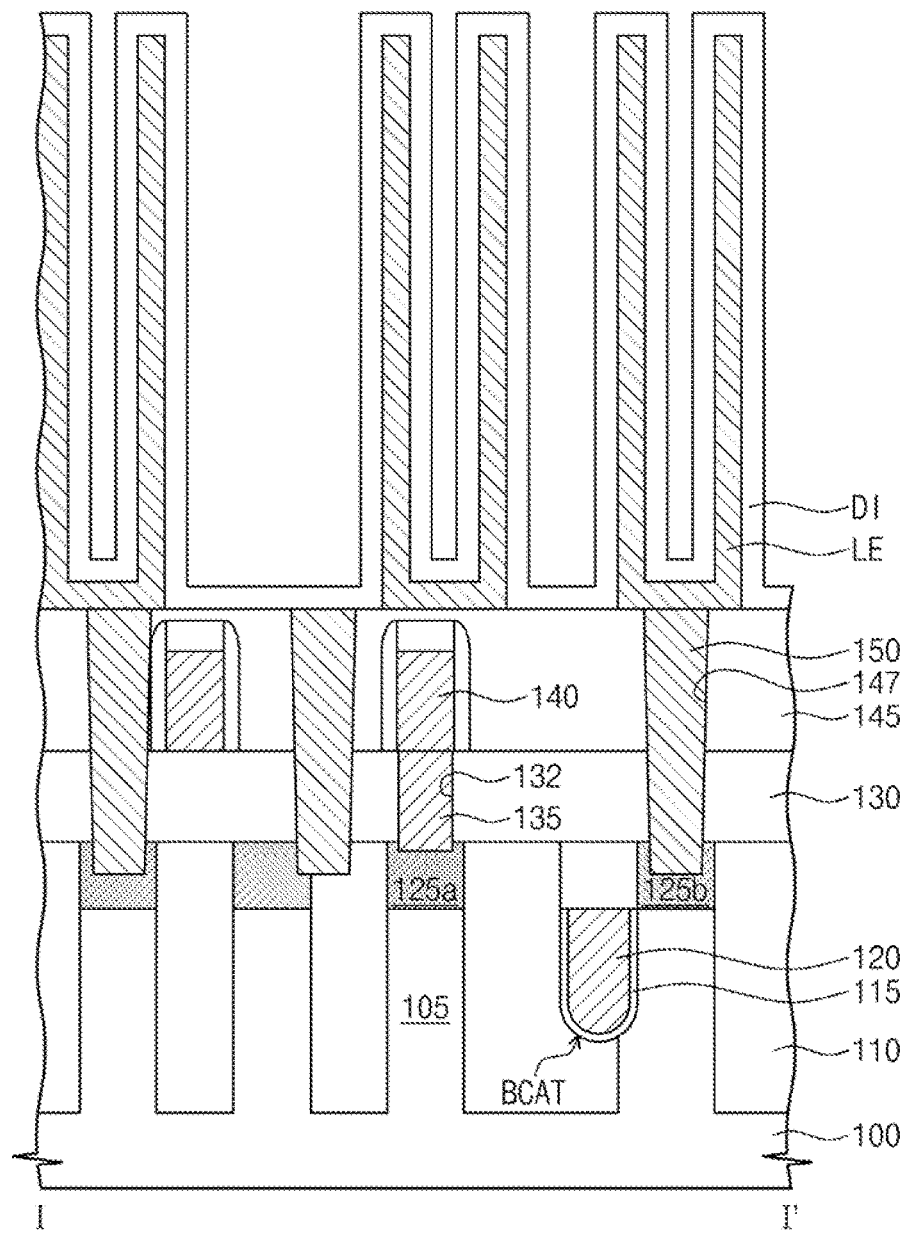

Referring to FIGS. 11A and 11B, in some embodiments, a dielectric layer DI may be formed to conformally cover the inner and outer side surfaces of the lower electrodes LE. The dielectric layer DI may be formed to be thin enough to allow an unfilled space to remain in the lower electrodes LE. The dielectric layer DI may be formed of or include at least one of high-k dielectric materials, whose dielectric constants are higher than that of silicon oxide.

Figure 12A:
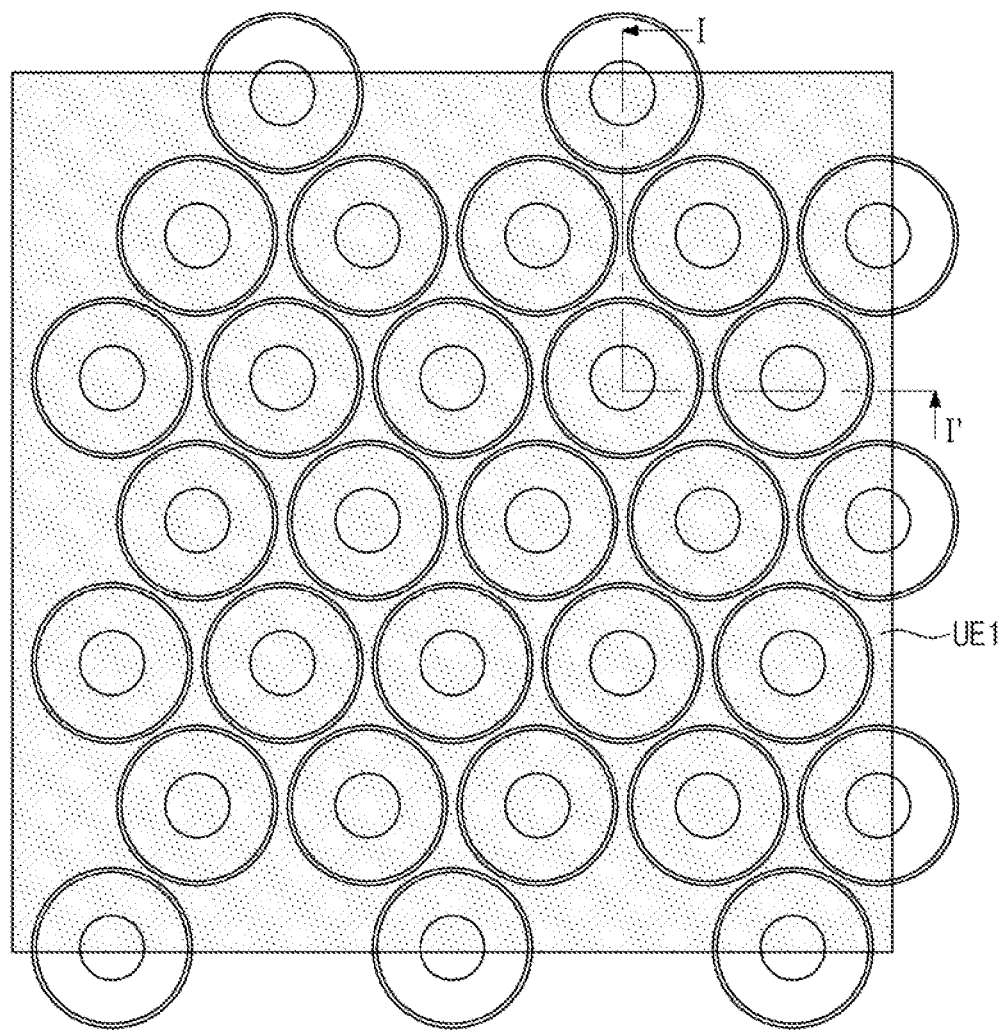
Figure 12B:
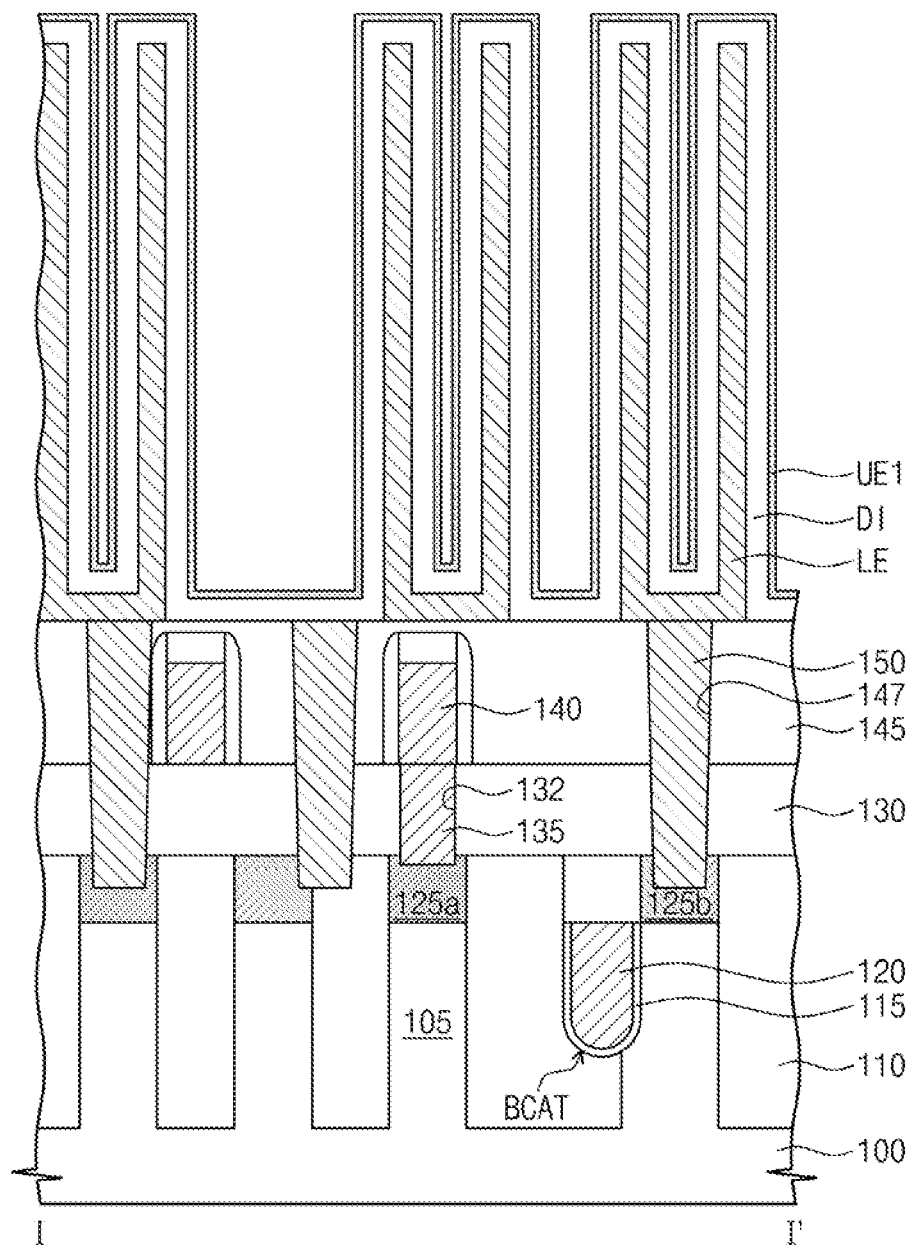

Referring to FIGS. 12A and 12B, in some embodiments, a first upper electrode UE1 may be formed on the dielectric layer DI. The first upper electrode UE1 may be deposited to conformally cover the inner and outer side surfaces of the lower electrodes LE. The first upper electrode UE1 may be formed to be thin enough to allow an unfilled space to remain in the lower electrodes LE provided with the dielectric layer DI. The formation of the first upper electrode UE1 may be performed in substantially the same manner as that described with reference to FIGS. 4, 5A through 5D, 6, and 7.

In some embodiments, the first upper electrode UE1 may be formed to prevent or suppress oxygen atoms in the dielectric layer DI from being diffused into a neighboring pattern. For example, the first upper electrode UE1 may be formed of or include titanium oxynitride ($Ti_xO_yN_z$). The first upper electrode UE1 may be formed to have a thickness ranging from about 1 Å to about 50 Å.

Figure 13A:
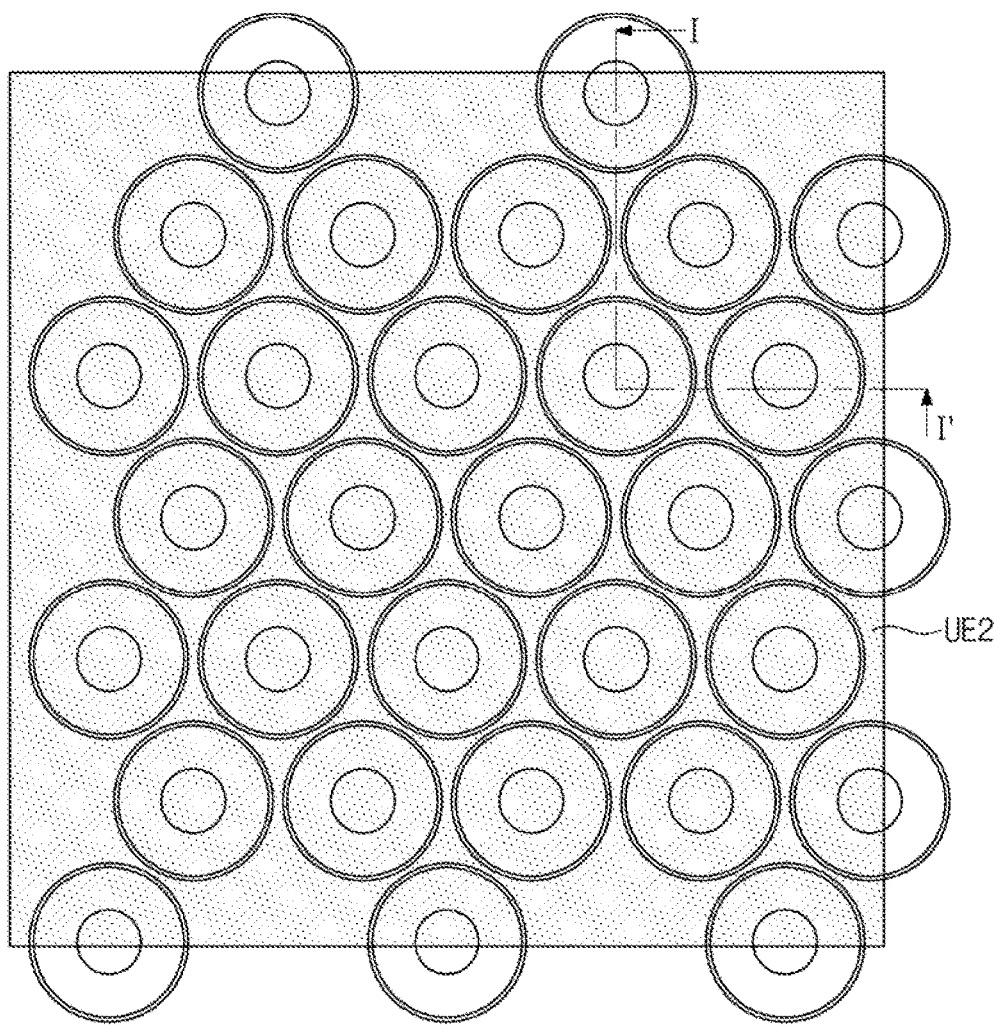
Figure 13B:
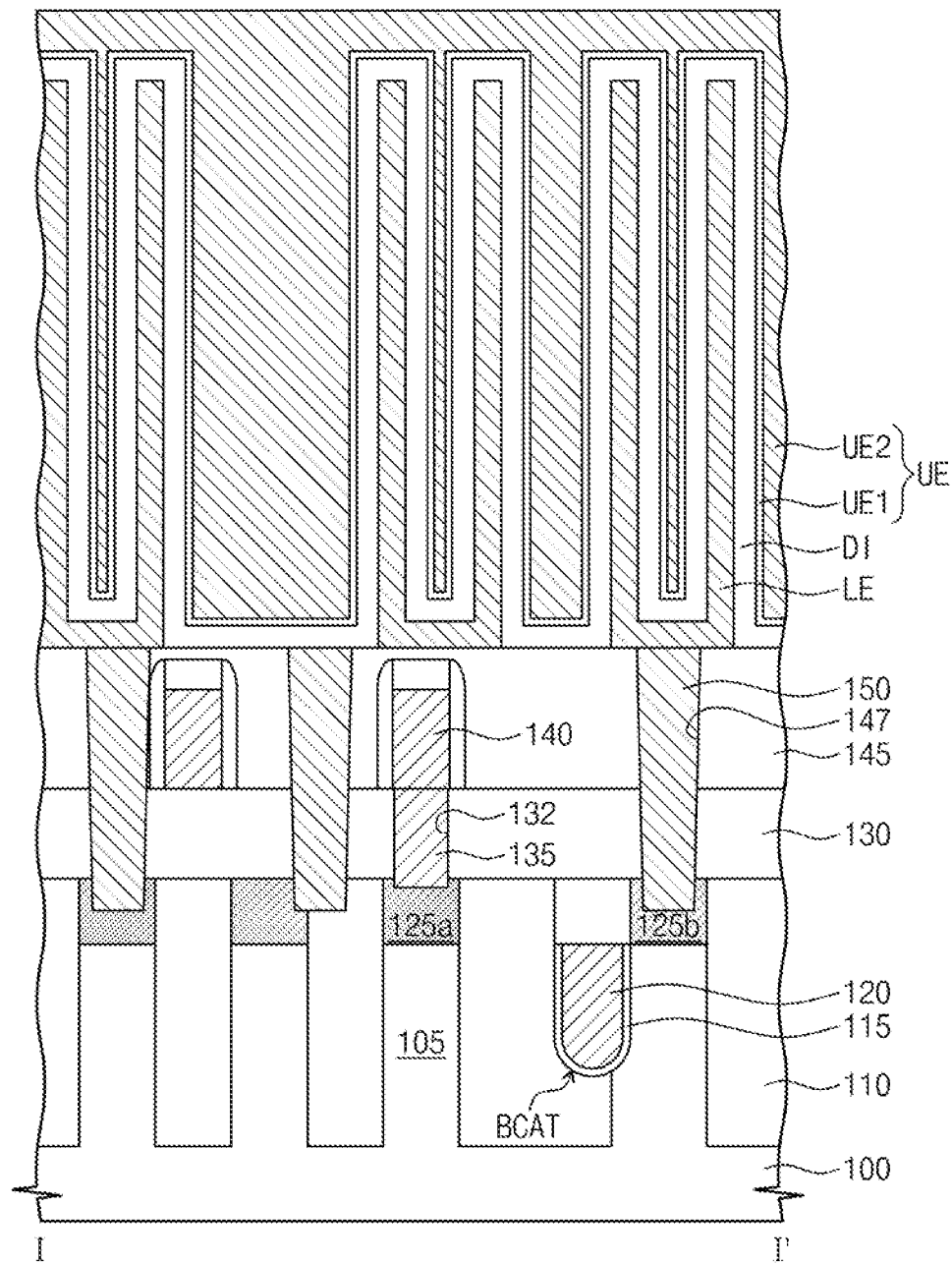

Referring to FIGS. 13A and 13B, in some embodiments, a second upper electrode UE2 may be formed on the first upper electrode UE1 to face the inner and outer side surfaces of the lower electrodes LE. The first upper electrode UE1 and the second upper electrode UE2 may constitute an upper electrode UE. For example, the second upper electrode UE2 may be formed of or include titanium or titanium nitride. The second upper electrode UE2 may be formed to have a thickness ranging from about 10 to about 100 Å. The formation of the second upper electrode UE2 may be performed in substantially the same manner as that described with reference to FIGS. 4, 5A through 5D, 6, and 7. The device of FIG. 13B may be a semiconductor device, such as a semiconductor memory chip (e.g., DRAM), a semiconductor package, or another semiconductor device.

The disclosed embodiments have been described with reference to the attached drawings, but it may be understood by one of ordinary skill in the art that the disclosed embodiments may be performed in other forms without changing the technical concept or essential features. Further, the above-described embodiments are merely examples and are not intended to limit or otherwise restrict the scope of the claims.

What is claimed is:

1. A semiconductor device, comprising:
  a substrate; and
  a capacitor electrically connected to the substrate,
  wherein the capacitor comprises:
  a lower electrode;
  a dielectric layer disposed on the lower electrode;
  a first upper electrode disposed on the dielectric layer;
  a second upper electrode disposed on the first upper electrode; and
  a third upper electrode disposed between the first upper electrode and the second upper electrode,
  wherein the first upper electrode contains metal oxynitride having a formula of $M_xO_yN_z$, in which a content of metallic element (M) is an amount in the range from about 30 at % to about 40 at % and a content of oxygen (O) is an amount in the range from about 15 at % to about 70 at %, and
  wherein the third upper electrode contains metal oxynitride whose oxygen content is lower than that of the first upper electrode and higher than that of the second upper electrode.

2. The semiconductor device of claim 1, wherein, in the first upper electrode, a content of nitrogen (N) is an amount in the range from about 0 at % to about 55 at %.

3. The semiconductor device of claim 1, wherein the metallic element (M) of the first upper electrode is titanium (Ti), and the second upper electrode contains titanium nitride (TiN).

4. The semiconductor device of claim 1, wherein the first upper electrode contacts the dielectric layer, and
the second upper electrode contacts the third upper electrode.

5. The semiconductor device of claim 1, further comprising:
a gate electrode provided on the substrate to cross an active region of the substrate,
wherein first and second impurity regions formed in the active region and at both sides of the gate electrode, and
wherein the capacitor is electrically connected to the first impurity region.

6. The semiconductor device of claim 5, further comprising a bit line, which is electrically connected to the second impurity region and is provided to cross the gate electrode.

7. A semiconductor device, comprising:
a substrate;
a capacitor electrically connected to the substrate, wherein the capacitor comprises:
a lower electrode;
a dielectric layer disposed on the lower electrode;
a first upper electrode disposed on the dielectric layer;
a second upper electrode disposed on the first upper electrode; and
a third upper electrode disposed between the first upper electrode and the second upper electrode, the third upper electrode having a first portion contacting the first upper electrode and a second portion contacting the second upper electrode, wherein
the first upper electrode contains metal oxynitride having a formula of $M_xO_yN_z$, in which an atomic percent of oxygen (O) is higher than an atomic percent of metallic element (M),
the dielectric layer contains metal oxide, in which an oxygen (O) content of the dielectric layer is lower than the oxygen (O) content of the first upper electrode, and
the third upper electrode contains metal oxynitride whose oxygen content is lower than that of the first upper electrode and higher than that of the second upper electrode.

8. The semiconductor device according to claim 7, wherein
the second upper electrode contains metal nitride in which an oxygen (O) content of the second upper electrode is lower than the oxygen content the first upper electrode.

9. The semiconductor device according to claim 7, wherein, in the first upper electrode, a content of metallic element (M) has an amount in the range from about 30 at % to about 40 at % and a content of oxygen (O) has an amount in the range from about 15 at % to about 70 at %.

* * * * *